United States Patent
Ha et al.

(10) Patent No.: US 7,451,385 B2
(45) Date of Patent: Nov. 11, 2008

(54) CHANNEL ENCODING APPARATUS AND METHOD

(75) Inventors: Jeong-Seok Ha, Atlanta, GA (US); Jaehong Kim, Seoul (KR); Steven McLaughlin, Decatur, GA (US); Seung-Bum Suh, Seoul (KR)

(73) Assignees: Samsung Electronics Co., Ltd. (KR); Georgia Tech Research Corporation, Atlanta, GA (US)

( * ) Notice: Subject to any disclaimer, the term of this patent is extended or adjusted under 35 U.S.C. 154(b) by 480 days.

(21) Appl. No.: 11/088,592

(22) Filed: Mar. 24, 2005

(65) Prior Publication Data

US 2005/0216820 A1 Sep. 29, 2005

Related U.S. Application Data

(60) Provisional application No. 60/555,889, filed on Mar. 24, 2004.

(30) Foreign Application Priority Data

Jan. 13, 2005 (KR) .................. 10-2005-0003461

(51) Int. Cl.
 *G06F 11/00* (2006.01)
(52) U.S. Cl. ...................... 714/800; 714/758
(58) Field of Classification Search ............... 714/758, 714/800
 See application file for complete search history.

(56) References Cited

U.S. PATENT DOCUMENTS

| | | | | |
|---|---|---|---|---|
| 3,588,819 A | * | 6/1971 | Tong | 714/787 |
| 4,555,784 A | * | 11/1985 | Wood | 714/785 |
| 5,606,569 A | * | 2/1997 | MacDonald et al. | 714/758 |
| 6,052,248 A | * | 4/2000 | Reed et al. | 360/53 |
| 6,615,387 B1 | * | 9/2003 | Williamson et al. | 714/785 |
| 2002/0059548 A1 | * | 5/2002 | Rushton | 714/758 |
| 2005/0034047 A1 | * | 2/2005 | Stek et al. | 714/758 |

FOREIGN PATENT DOCUMENTS

WO  WO 03/061139 A2  7/2003

OTHER PUBLICATIONS

Richardson et al., "Efficient Encoding of Low-Density Parity-Check Codes", IEEE Transactions on Information Theory, vol. 47, No. 2, Feb. 2001, pp. 638-656.

* cited by examiner

*Primary Examiner*—Jacques Louis-Jacques
*Assistant Examiner*—Sam Rizk
(74) *Attorney, Agent, or Firm*—McNeely Bodendorf LLP

(57) ABSTRACT

A channel encoding apparatus and method are provided in which part of the parity bits are set to erroneous bits, and full parity bits are created by correcting the erroneous bits using a channel decoding apparatus of a receiver in a communication system. In the channel encoding apparatus, in order to generate a coded bit stream by adding a parity bit stream to a message bit stream, a partial parity generator generates a partial parity bit stream as a part of the parity bit stream using the message bit stream, an erasure generator generates a bit stream having an erroneous value as the remaining part of the parity bit stream, and a decoder calculates the value of the parity bit stream by correcting the bit stream having the erroneous value using a parity-check matrix that determines the parity bit stream, the message bit stream, and the partial parity bit stream.

14 Claims, 6 Drawing Sheets

CHANNEL ENCODING APPARATUS AND METHOD

PRIORITIES

This application claims priority under 35 U.S.C. § 119 to an application entitled "Channel Encoding Apparatus and Method" filed in the U.S. Patent and Trademark Office on Mar. 24, 2004 and assigned Ser. No. 60/555,889, and filed in the Korean Intellectual Property Office on Jan. 13, 2005 and assigned No. 2005-3461, the contents of both of which are incorporated herein by reference.

BACKGROUND OF THE INVENTION

1. Field of the Invention

The present invention relates generally to a channel encoding apparatus and method, and in particular, to a channel encoding apparatus and method in which parity bits are partially set to artificial erroneous bits, and full parity bits are created by correcting the erroneous bits using a channel decoding apparatus provided at a receiver of a communication system.

2. Description of the Related Art

Typically, a channel encoder forms codewords by adding parity bits to message bits to be transmitted, and a channel decoder extracts the message bits from the received codewords by carrying out the reverse of the channel encoding.

FIG. 1 illustrates data structures in typical channel encoding and decoding.

Referring to FIG. 1, the channel encoder creates an n-bit codeword by adding an m-bit parity bit stream to a k-bit message, prior to transmission.

Information loss or errors takes place during data transmission or data storage due to noise, distortion and interference in various forms in a communication system or a data storing system. Error correction is a requisite against such errors.

The channel decoder, therefore, receives errors on a channel as well as the n-bit codeword and recovers the k-bit message by correcting for the errors.

As illustrated in FIG. 2, the typical channel encoder is comprised of an input buffer 21 for receiving message bits to be transmitted, a parity calculator 22 for calculating parity bits based on the message bits, a pre-processor 24 for calculating a generator matrix having codeword generation information by a matrix operation, specifically using the relationship of $GH^T=0$ (G is the generator matrix and H is a parity check matrix), a memory 23 for storing the matrix information, and an output buffer 25 for outputting codewords. More specifically, the parity calculator 22 calculates the parity bits using the message bits received from the input buffer 21 referring to the matrix information stored in the memory 23. The output buffer 25 outputs the message bits received from the input buffer 21 and the parity bits received from the parity calculator 22.

In the above-described general channel encoding, it is known that the computation complexity of the pre-processor 24 is $0(n^3)$ where n is a codeword length, and the actual computation complexity of the parity calculator 22 is $0(n^2)$.

As a channel code, an LDPC (Low-Density Parity-Check) code exhibits performance close to the Shannon Limit representing the theoretical limit of channel coding performance. Yet, its codeword length is so large that an LDPC encoder is a highly complex device, and the LDPC code requires a large memory capacity. Especially it is known that hardware complexity is larger in the LDPC encoder than in the LDPC decoder.

To overcome the complexity, a conventional LDPC encoding method, as described in "Efficient Encoding of Low-Density Parity-Check Codes", Thomas J. Richardson and Rudiger L. Urbanke, IEEE Transaction on Information Theory February 2001, decomposes a parity-check matrix into partition matrices and parity bits are separately calculated in two parts, as illustrated in FIG. 3. In this example, let a codeword length and a parity length be denoted by n and m, respectively. A message length is then (n−m). If a first parity length is g, a second parity length is (m−g).

FIG. 4 is a block diagram of an encoder configured to perform the conventional LDPC encoding method. Referring to FIG. 4, a pre-processor 45 decomposes a parity-check matrix into partition matrices as illustrated in FIG. 3. A first parity calculator 42 calculates first parity bits using the partition matrices and a second parity calculator 43 calculates second parity bits using the first parity bits. Input buffer 41 and output buffer 46 are also shown, This method also further requires a memory 44 for storing the partition matrices in addition to an existing memory for encoding. For a codeword length of n, the pre-processing computation volume reaches $0(n^{3/2})$. Hence, as the codeword length is increased, the complexity also increases. A complexity of $0(n+g^2)$ is required to calculate the first parity bits, and a complexity of $9(n)$ to calculate the second parity bits. Moreover, the inverse matrix of a certain matrix must exist to achieve the partition matrices.

SUMMARY OF THE INVENTION

An object of the present invention is to substantially solve at least the above problems and/or disadvantages and to provide at least the advantages below. Accordingly, an object of the present invention is to provide a method and apparatus for performing channel encoding by utilizing a channel decoding having an error correction function.

Another object of the present invention is to provide a channel encoding apparatus and method for generating an erasure bit stream having an erroneous value as a part of a parity bit stream and correcting the erasure bit stream using a channel decoding apparatus, thereby calculating a full parity bit stream.

The above and other objects are achieved by providing a channel encoding apparatus and method in which parity bits are partially set to artificially erroneous bits and full parity bits are created by correcting the erroneous bits using a channel decoding apparatus provided at a receiver of a communication system.

According to one aspect of the present invention, in a channel encoding apparatus for generating a coded bit stream of a predetermined length by adding a parity bit stream to a message bit stream to be transmitted, a channel decoding apparatus in a communication system which receives the coded bit stream recovers the message bit stream from the coded bit stream through error correction.

According to another aspect of the present invention, in a channel encoding apparatus for generating a coded bit stream of a predetermined length by adding a parity bit stream to a message bit stream to be transmitted, a partial parity generator generates a partial parity bit stream having a predetermined length and a predetermined value as a part of the parity bit stream, based on the message bit stream, an erasure generator generates a bit stream having a random erroneous value as the remaining part of the parity bit stream except the partial parity bit stream, and a decoder calculates the value of the parity bit stream by correcting the bit stream having the erroneous value using a parity-check matrix used for determining the parity bit stream, the message bit stream, and the partial parity bit stream, and outputs the message bit stream and the parity bit stream.

According to a further aspect of the present invention, in a channel encoding method for generating a coded bit stream of a predetermined length by adding a parity bit stream to a message bit stream to be transmitted, the message bit stream is recovered from the coded bit stream through error correction using a channel decoding method in a communication system that receives the coded bit stream.

According to still another aspect of the present invention, in a channel encoding method for generating a coded bit stream of a predetermined length by adding a parity bit stream to a message bit stream to be transmitted, a partial parity bit stream having a predetermined length and a predetermined value is generated as a part of the parity bit stream, based on the message bit stream, a bit stream having a random erroneous value is generated as the remaining part of the parity bit stream except the partial parity bit stream, the value of the parity bit stream is calculated by correcting the bit stream having the erroneous value using a parity-check matrix used for determining the parity bit stream, the message bit stream, and the partial parity bit stream, and the message bit stream and the parity bit stream are output.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

A preferred embodiment of the present invention will be described herein below with reference to the accompanying drawings. In the following description, well-known functions or constructions are not described in detail since they would obscure the invention in unnecessary detail.

Figure 1:
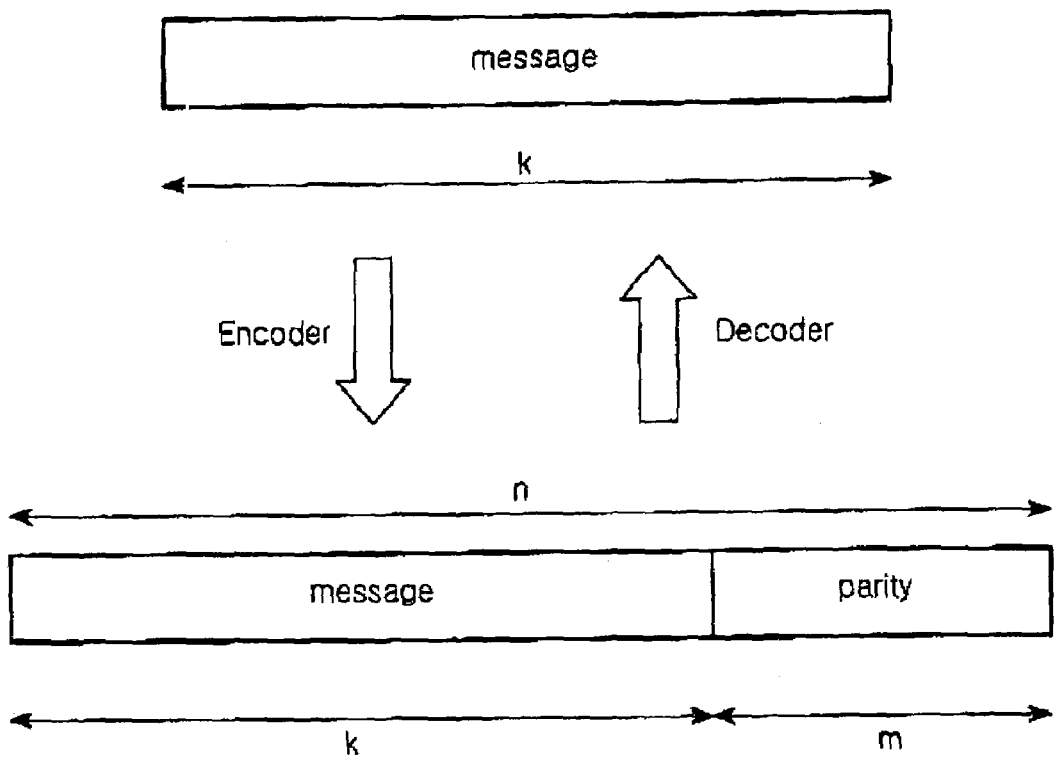
FIG. 1 illustrates data structures in typical channel encoding and decoding.
Figure 2:
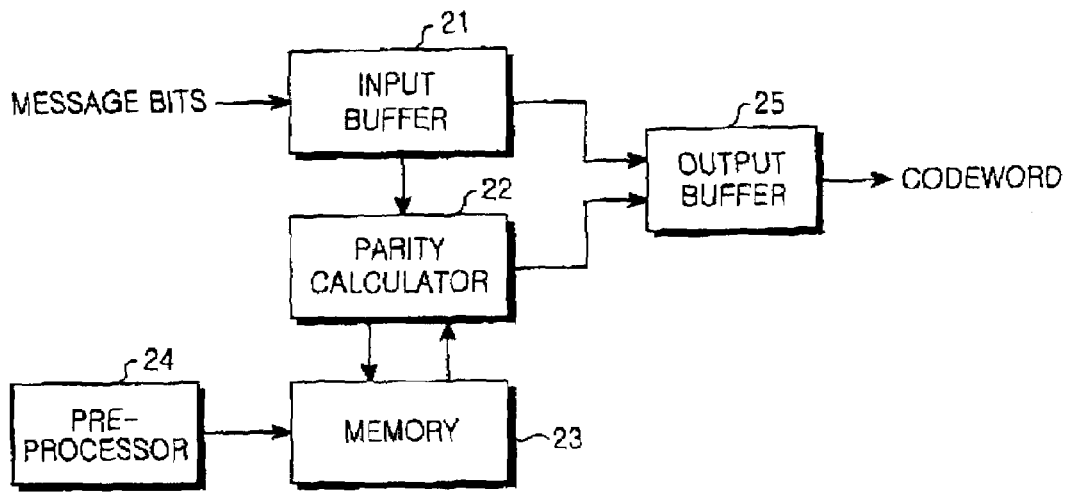
FIG. 2 is a block diagram of a typical channel encoder.
Figure 3:
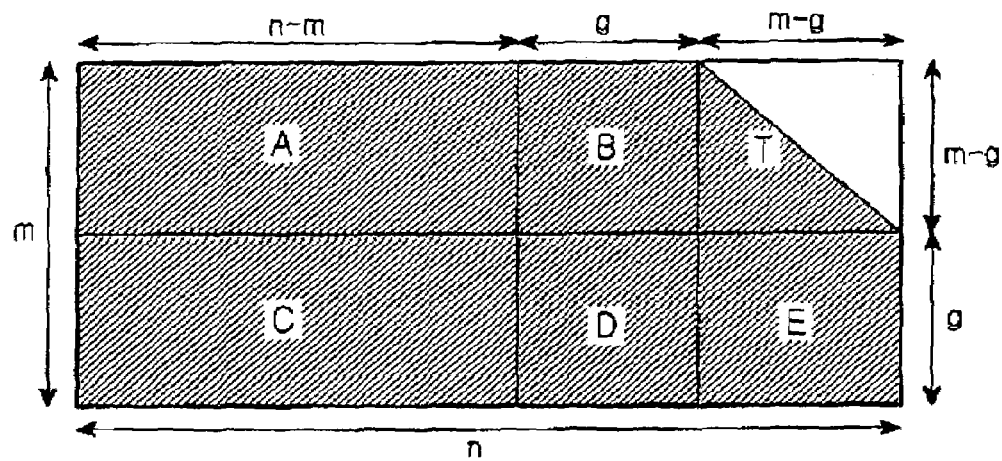
FIG. 3 illustrates pre-processing for a conventional encoding utilizing triangular factorization.
Figure 4:
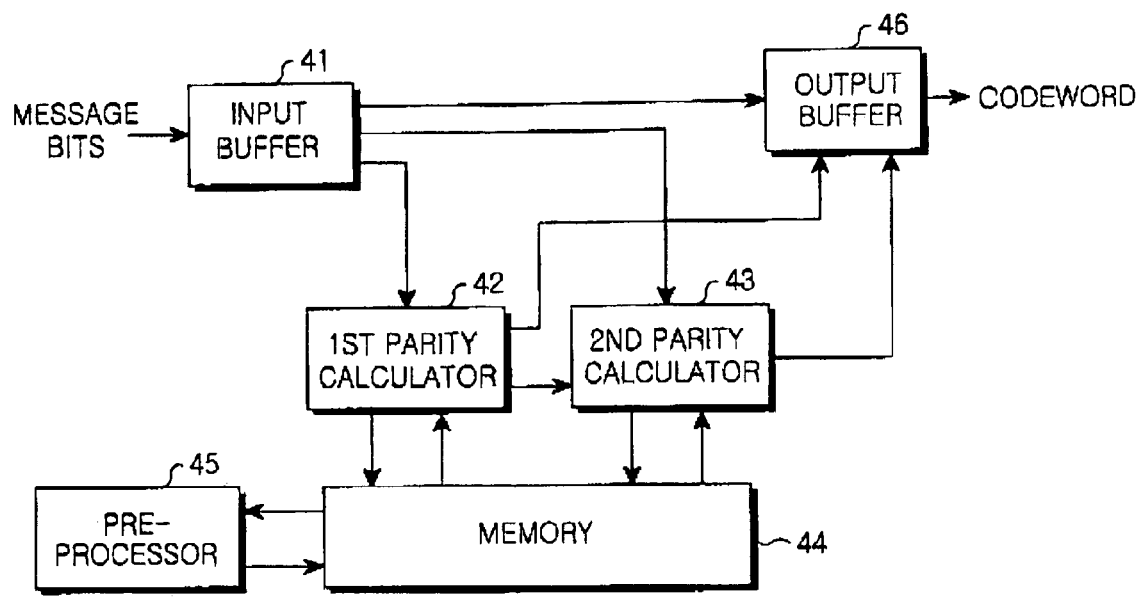
FIG. 4 is a block diagram of a conventional encoder utilizing the triangular factorization.
Figure 5:
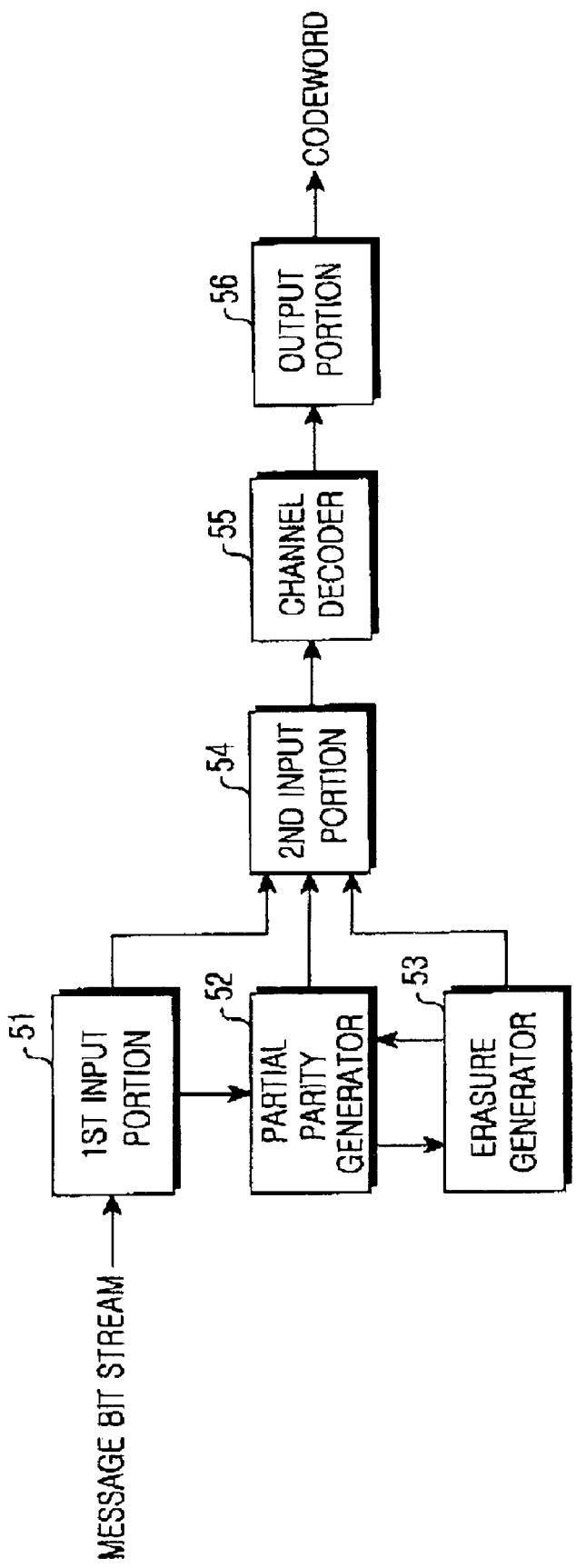
FIG. 5 is a block diagram of a channel encoder according to the present invention.
Figure 6:
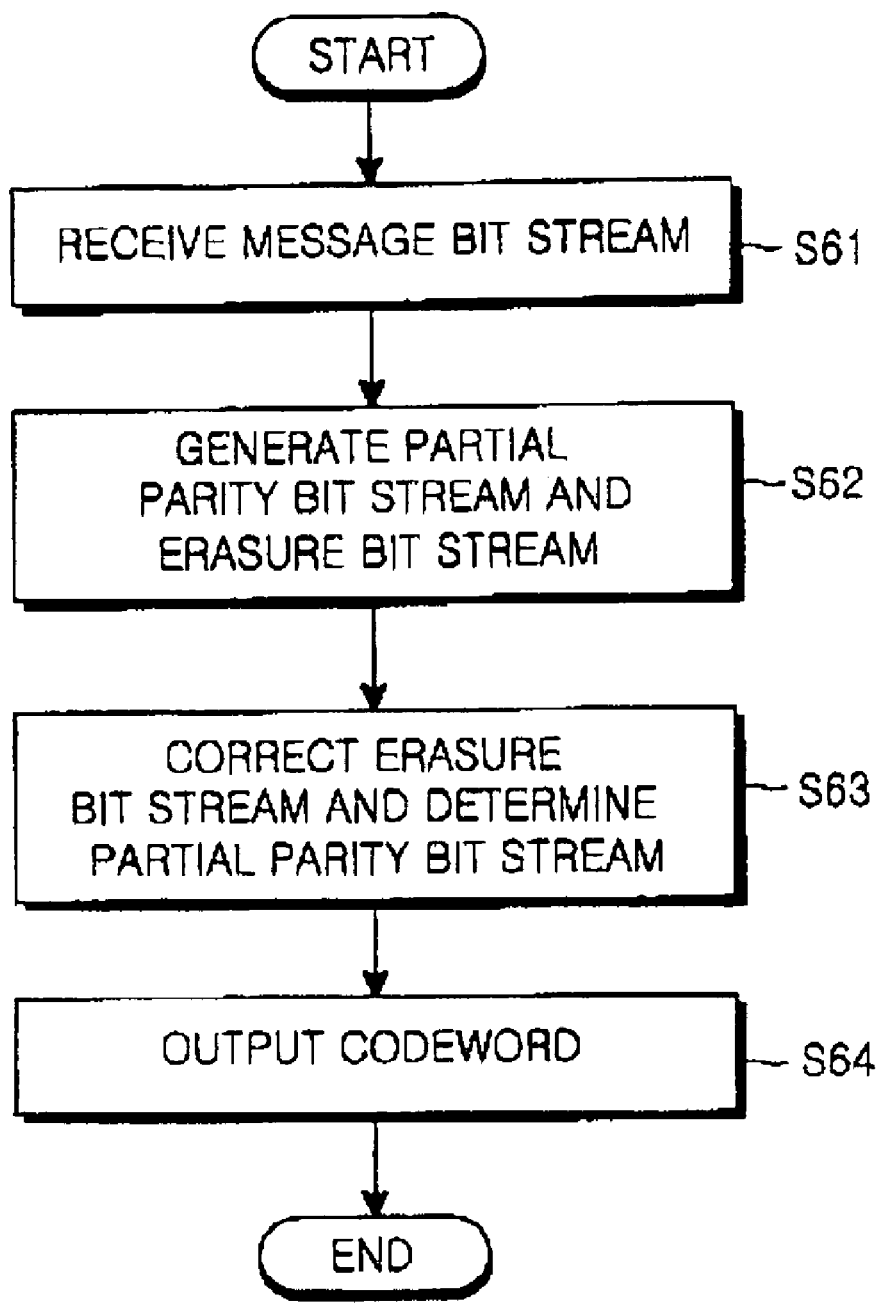
FIG. 6 is a flowchart illustrating a channel encoding method according to the present invention.

FIG. 5 is a block diagram of a channel encoding apparatus according to the present invention and FIG. 6 is a flowchart illustrating a channel encoding method according to the present invention.

Referring to FIGS. 5 and 6, the channel encoding apparatus of the present invention includes a first input portion 51, a partial parity generator 52, an erasure generator 53, a second input portion 54, a channel decoder 55, and an output portion 56.

The first input portion 51 receives a message bit stream in step S61. The partial parity generator 52 generates a partial parity bit stream as a part of a full parity bit stream. Given a plurality of partial parity bit stream values, the partial parity generator 52 sequentially outputs a plurality of partial parity bit streams. The number of bits of the partial parity bit stream is variable with that of the message bit stream.

The erasure generator 53 generates an erasure bit stream to be filled in the remaining area of the full parity bit stream except that area occupied by the partial parity bit stream. In accordance with the present invention, the erasure bit stream does not form the full parity stream together with the partial parity bit stream. Instead, it is made up of artificial erroneous bits to be inserted into the parity bit stream for the purpose of reducing the computation volume of calculating a thoroughly correct parity bit stream and its entailing system implementation complexity. For example, the erasure bit stream can be set to a mean value that becomes A/2 in a unipolar signaling system using (0, A0 and becomes 0 in a bipolar signaling system using (+A, −A) in step S62.

Figure 7:
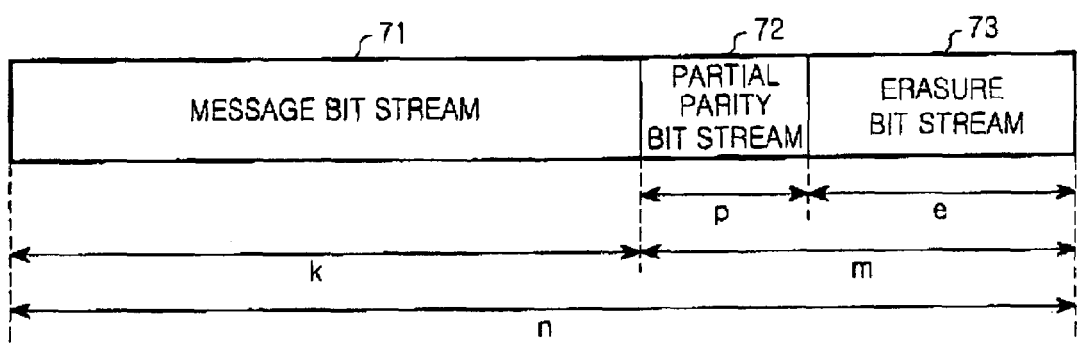
FIG. 7 illustrates a channel coded data structure according to an embodiment of the present invention.

FIG. 7 illustrates a channel coded data structure according to an embodiment of the present invention. Referring to FIG. 7, the channel coded data is an n-bit codeword made up of a k-bit message bit stream 71 and an m-bit parity bit stream divided into a p-bit partial parity bit stream 72 and an e-bit erasure bit stream 73. The partial parity generator 52 generates the p-bit partial parity bit stream and the erasure generator 53 generates the e-bit erasure bit stream.

The second input portion 54 provides a channel decoder 55 with the message bit stream received from the first input portion 51, the partial parity bit stream received from the partial parity generator 52, and the erasure bit stream received from the erasure generator 53.

The channel decoder 55 corrects for the erroneous value of the erasure bit stream by its error correction function. In the case where the partial parity generator 52 sequentially outputs a plurality of partial parity bits streams for the same message bit stream, the channel decoder 55 corrects the erasure bit stream with respect to the partial parity bit streams output from the second input portion 54. In the course of the erasure bit correction, one of the partial parity bit streams is determined as a correct partial parity bit stream in step S63. Once the correct partial parity bit stream is determined, the channel decoder 55 may control the partial parity generator 52 to discontinue outputting the following partial parity bit streams which have not been input to the channel decoder 55.

The channel decoder 55 is identical to a channel decoding apparatus at a receiver in a communication system having the channel encoding apparatus. Therefore, the channel decoder 55 can be configured to be an erasure decoder or an LDPC decoder using a Min-Sum algorithm. The channel encoding apparatus of the present invention is characterized in that a correct parity bit stream is calculated by correcting for the erroneous value of an erasure bit stream using a channel decoder to provide for error correction at the receiver. Preferably, the number of bits of the erasure bit stream is determined within a range affordable for the error correction capability of the channel decoder 55, taking into account the number of the bits of the partial parity bit stream.

After the correction of the erasure bit stream, the channel decoder 55 outputs the message bit stream and a full parity bit stream made up of the partial parity bit stream and the corrected erasure bit stream through the output portion 56 in step S64. Given a plurality of partial parity bit streams, the channel decoder 55 outputs the correct partial parity bit stream selected during the erasure bit correction to the output portion 56.

A description will now be made of an operation in the channel decoder 55 for, given a plurality of partial parity bit streams from the partial parity generator 52, correcting an erasure bit stream and selecting a correct partial parity bit stream among the plurality of partial parity bit streams according to an embodiment of the present invention.

Let a message bit stream be denoted by s1, s2, s3, s4, s5, a partial parity bit stream be denoted by p1, p2, and an erasure bit stream be denoted by e1, e2, e3. A parity-check matrix H is given as Equation (1). Four cases of 00, 01, 10, 11 are available as p1p2 out of the two bits p1 and p2 of the partial parity bit stream and the partial parity generator 52 sequentially outputs these four cases. Erasure bit stream e1, e2 and e3 that is calculated with one of the four cases that satisfies all of Equation (2) to Equation (6) are determined as the erasure bit stream, and p1 and p2 are determined as the partial parity bit stream.

$$H = \begin{bmatrix} h10 & h11 & h12 & h13 & h14 & h15 & h16 & h17 & h18 & h19 \\ h20 & h21 & h22 & h23 & h24 & h25 & h26 & h27 & h28 & h29 \\ h30 & h31 & h32 & h33 & h34 & h35 & h36 & h37 & h38 & h39 \\ h40 & h41 & h42 & h43 & h44 & h45 & h46 & h47 & h48 & h49 \\ h50 & h51 & h52 & h53 & h54 & h55 & h56 & h57 & h58 & h59 \end{bmatrix} \quad (1)$$

$$h10s1 + h11s2 + h12s3 + h13s4 + h14s5 + \\ h15e1 + h16e2 + h17e3 + h18p1 + h19p2 = 0 \quad (2)$$

$$h20s1 + h21s2 + h22s3 + h23s4 + h24s5 + \\ h25e1 + h26e2 + h27e3 + h28p1 + h29p2 = 0 \quad (3)$$

$$h30s1 + h31s2 + h32s3 + h33s4 + h34s5 + \\ h35e1 + h36e2 + h37e3 + h38p1 + h39p2 = 0 \quad (4)$$

$$h40s1 + h41s2 + h42s3 + h43s4 + h44s5 + \\ h45e1 + h46e2 + h47e3 + h48p1 + h49p2 = 0 \quad (5)$$

$$h50s1 + h51s2 + h52s3 + h53s4 + h54s5 + \\ h55e1 + h56e2 + h57e3 + h58p1 + h59p2 = 0 \quad (6)$$

The calculations of Equation (2) through Equation (6) only consider the last bit values of bit streams involved in the calculations.

If the parity-check matrix defined as Equation (1) is given as Equation (7), the message bit stream is 10110, and the partial parity bit streams are 00, 01, 10 and 11, the bit values of the erasure bit stream are produced by Equation (2) to Equation (6), as illustrated in Table 1.

$$H = \begin{bmatrix} 1 & 1 & 1 & 1 & 1 & 1 & 0 & 0 & 0 & 0 \\ 1 & 1 & 1 & 0 & 0 & 0 & 1 & 1 & 1 & 0 \\ 1 & 0 & 0 & 1 & 1 & 0 & 1 & 1 & 1 & 0 \\ 0 & 1 & 0 & 1 & 0 & 1 & 1 & 0 & 1 & 1 \\ 0 & 0 & 1 & 0 & 1 & 1 & 0 & 1 & 1 & 1 \end{bmatrix} \quad (7)$$

TABLE 1

| Partial parity bit streams (p1p2) | Erasure bit streams (e1e2e3) |
|---|---|
| 00 | 100 |
| 01 | 111 |
| 10 | 111 |
| 11 | 100 |

Because Equation (3) and Equation (4) are not satisfied for the partial parity bit streams of 01, 10 and 11, the partial parity bit stream 00 is determined as a correct stream and its corresponding erasure bit stream 100 is selected. In the codeword structure illustrated in FIG. 6, the output codeword is 1011000100.

As described above, the present invention configures a channel encoding apparatus using a channel decoding apparatus, which obviates the need for an additional memory and pre-processing for the matrix operation and thus simplifies hardware structure. Furthermore, a communication system requiring both an encoding apparatus and a decoding apparatus can carry out encoding and decoding by implementing the decoding apparatus only. This leads to the decrease of hardware area and a simplified hardware structure.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A channel encoding apparatus for generating a coded bit stream of a predetermined length by adding a parity bit stream to a message bit stream to be transmitted, comprising:
   a partial parity generator for generating a partial parity bit stream having a predetermined length and a predetermined value as a part of the parity bit stream, based on the message bit stream;
   an erasure generator for generating an erasure bit stream having a random erroneous value, the length of the erasure bit stream being equal to the parity stream length less the partial parity bit stream length; and
   a decoder for calculating the value of the parity bit stream by correcting the bit stream having the erroneous value using a parity-check matrix used for determining the parity bit stream, the message bit stream, and the partial parity bit stream, and outputting the message bit stream and the parity bit stream.

2. The channel encoding apparatus of claim 1, wherein if there are a plurality of values for the partial parity bit stream, the partial parity generator sequentially outputs the plurality of partial parity bit streams.

3. The channel encoding apparatus of claim 2, further comprising a first input portion for receiving the message bit stream and providing the message bit stream to the partial parity generator and the decoder.

4. The channel encoding apparatus of claim 2, further comprising:
   a first input portion for receiving the message bit stream and providing the message bit stream to the partial parity generator; and
   a second input portion for receiving the message bit stream from the first input portion, the partial parity bit stream from the partial parity generator, and the bit stream having the erroneous value from the erasure generator, and outputting the message bit stream, the partial parity bit stream, and the bit stream having the erroneous value to the decoder.

5. The channel encoding apparatus of claim 1, wherein if there are a plurality of values for the partial parity bit stream, the decoder achieves the parity bit stream by selecting a partial parity bit stream value that satisfies the parity-check matrix in conjunction with the corrected bit stream from among the plurality of partial parity bit stream values.

6. The channel encoding apparatus of claim 5, further comprising a first input portion for receiving the message bit stream and providing the message bit stream to the partial parity generator and the decoder.

7. The channel encoding apparatus of claim 5, further comprising:
  a first input portion for receiving the message bit stream and providing the message bit stream to the partial parity generator; and
  a second input portion for receiving the message bit stream from the first input portion, the partial parity bit stream from the partial parity generator, and the bit stream having the erroneous value from the erasure generator, and outputting the message bit stream, the partial parity bit stream, and the bit stream having the erroneous value to the decoder.

8. The channel encoding apparatus of claim 1, further comprising a first input portion for receiving the message bit stream and providing the message bit stream to the partial parity generator and the decoder.

9. The channel encoding apparatus of claim 1, further comprising:
  a first input portion for receiving the message bit stream and providing the message bit stream to the partial parity generator; and
  a second input portion for receiving the message bit stream from the first input portion, the partial parity bit stream from the partial parity generator, and the bit stream having the erroneous value from the erasure generator, and outputting the message bit stream, the partial parity bit stream, and the bit stream having the erroneous value to the decoder.

10. A channel encoding method for generating a coded bit stream of a predetermined length by adding a parity bit stream to a message bit stream to be transmitted, comprising the steps of:
  (a) generating a partial parity bit stream having a predetermined length and a predetermined value as a part of the parity bit stream, based on the message bit stream;
  (b) generating a bit stream having a random erroneous value as the remaining part of the parity bit stream less the partial parity bit stream; and
  (c) calculating the value of the parity bit stream by correcting the bit stream having the erroneous value using a parity-check matrix used for determining the parity bit stream, the message bit stream, and the partial parity bit stream, and outputting the message bit stream and the parity bit stream.

11. The channel encoding method of claim 10, wherein the step of (a) comprises the step of, if there are a plurality of values for the partial parity bit stream, sequentially outputting the plurality of partial parity bit streams.

12. The channel encoding method of claim 10, wherein the step of (c) comprises the step of, if there are a plurality of values for the partial parity bit stream, achieving the parity bit stream by selecting a partial parity bit stream value that satisfies the parity-check matrix in conjunction with the corrected bit stream from among the plurality of partial bit stream values.

13. A channel encoding method for generating a coded bit stream of a predetermined length by adding a parity bit stream to a message bit stream to be transmitted, comprising the steps of:
  setting part of the parity bit stream to an erroneous value; and
  recovering the message bit stream from the coded bit stream through error correction using a channel decoding method in a communication system that receives the coded bit stream,
  wherein the parity bit stream is generated by correcting the erroneous value using the channel decoding method.

14. The channel encoding method of claim 13, wherein the channel decoding method corrects a bit stream having the erroneous value using a parity-check matrix used for determining the parity bit stream, the message bit stream, and the remaining parity bit stream of the parity bit stream less the bit stream having the erroneous value.

* * * * *